United States Patent
Youn et al.

(10) Patent No.: US 11,704,251 B2
(45) Date of Patent: Jul. 18, 2023

(54) BANKED MEMORY ARCHITECTURE FOR MULTIPLE PARALLEL DATAPATH CHANNELS IN AN ACCELERATOR

(71) Applicant: Microsoft Technology Licensing, LLC, Redmond, WA (US)

(72) Inventors: Stephen Sangho Youn, Bellevue, WA (US); Steven Karl Reinhardt, Vancouver, WA (US); Hui Geng, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 17/730,707

(22) Filed: Apr. 27, 2022

(65) Prior Publication Data
US 2022/0253384 A1    Aug. 11, 2022

Related U.S. Application Data

(63) Continuation of application No. 17/097,205, filed on Nov. 13, 2020, now Pat. No. 11,347,652.

(60) Provisional application No. 63/072,427, filed on Aug. 31, 2020.

(51) Int. Cl.
| | |
|---|---|
| G06F 12/08 | (2016.01) |
| G06F 12/00 | (2006.01) |
| G11C 7/10 | (2006.01) |
| G06F 12/0897 | (2016.01) |
| G11C 11/4076 | (2006.01) |

(52) U.S. Cl.
CPC ........ *G06F 12/0897* (2013.01); *G11C 7/1006* (2013.01); *G11C 7/1057* (2013.01); *G11C 7/1072* (2013.01); *G11C 11/4076* (2013.01)

(58) Field of Classification Search
CPC .............. G06F 16/2453; G06F 16/283; G06F 12/0897; G06F 12/0813; G11C 7/1006; G11C 7/1057; G11C 7/1072; G11C 11/4076
USPC ......................................................... 711/119
See application file for complete search history.

(56) References Cited

U.S. PATENT DOCUMENTS

| | | | |
|---|---|---|---|
| 11,080,210 B2* | 8/2021 | Mittal | G06F 13/4221 |
| 11,468,002 B2* | 10/2022 | Snelgrove | G06F 15/7821 |
| 2021/0110876 A1* | 4/2021 | Seo | G11C 16/10 |
| 2021/0133125 A1* | 5/2021 | Ryu | G06F 30/34 |
| 2021/0312320 A1* | 10/2021 | Shah | G06N 3/045 |
| 2022/0121918 A1* | 4/2022 | Nagarajan | G06N 3/04 |

* cited by examiner

*Primary Examiner* — Ly D Pham
(74) *Attorney, Agent, or Firm* — Ray Quinney & Nebeker; Tiffany Healy

(57) ABSTRACT

The present disclosure relates to devices and methods for using a banked memory structure with accelerators. The devices and methods may segment and isolate dataflows in datapath and memory of the accelerator. The devices and methods may provide each data channel with its own register memory bank. The devices and methods may use a memory address decoder to place the local variables in the proper memory bank.

15 Claims, 15 Drawing Sheets

828

```
//Mx+b with for loop
1|int numVecs = 2;
2|int tiles = 3;
3|SetIterationsCols(1, tiles);
4|for (int n = 0; n < numVecs; n++)
5| {
6|   v_rd(MemIds_MvmInitialVrf,
x+n*tiles);
7|   mv_mul(M);
8|   vv_add(AddSubVrf_0, b);
9|   v_wr(NetOutputQ, DONTCARE);
10| }
```

830

```
//Mx+b with SetIterationsCols ()
1|int numVecs = 2;
2|int tiles = 3;
3|SetIterationsCols(numVecs, tiles);
4|v_rd_inc(MemIds_MvmInitialVrf, x, tiles);
5|mv_mul(M);
6|vv_add(MemIds_AddSubVrf_0, b);
7|v_wr(NetOutputQ, DONTCARE);
```

```
1|int numVecs = 6;
2|int tiles = 2;
3|SetIterationsCols(numVecs, tiles);
4|v_rd_inc(MvmInitialVrf, x, tiles);
5|mv_mul(M1);
6|vv_add(MemIds_AddSubVrf_0, b1);
7|v_wr_inc(MvmInitialVrf, x, tiles);
```

834

```
8|numVecs = 6;
9|tiles = 1;
10|SetIterationsCols(numVecs, tiles);
11|v_rd_inc(MvmInitialVrf, x, tiles);
12|mv_mul(M2);
13|vv_add(MemIds_AddSubVrf_0, b2);
14|v_wr_inc(MvmInitialVrf, x, tiles);
```

836

```
15|numVecs = 4;
16|tiles = 3;
17|SetIterationsCols(numVecs, tiles);
18|v_rd_inc(MvmInitialVrf, x, tiles);
19|mv_mul(M3);
20|vv_add(MemIds_AddSubVrf_0, b3);
21|v_wr_inc(MvmInitialVrf, x, tiles);
```

838

| a0 | b0 | c0 |
|----|----|----|
| a1 | b1 | c1 |
| a2 | b2 | c2 |
| a3 | b3 | c3 |
| a4 | b4 | c4 |
| a5 | b5 | c5 |
| a6 | b6 | c6 |
| a7 | b7 | c7 |

840

| a0 | b0 | c0 |
|----|----|----|
| a1 | b1 | c1 |
| a2 | b2 | c2 |
| a3 | b3 | c3 |
| a4 | b4 | c4 |
| a5 | b5 | c5 |
| a6 | b6 | c6 |
| a7 | b7 | c7 |

842

| a0 | b0 | c0 |
|----|----|----|
| a1 | b1 | c1 |
| a2 | b2 | c2 |
| a3 | b3 | c3 |
| a4 | b4 | c4 |
| a5 | b5 | c5 |
| a6 | b6 | c6 |
| a7 | b7 | c7 |

FIG. 8D

BANKED MEMORY ARCHITECTURE FOR MULTIPLE PARALLEL DATAPATH CHANNELS IN AN ACCELERATOR

CROSS REFERENCE TO RELATED APPLICATIONS

This application is a Continuation of U.S. application Ser. No. 17/097,205, filed Nov. 13, 2020, which claims benefit and priority to U.S. Provisional Application No. 63/072,427, filed Aug. 31, 2020, which are incorporated herein by reference in their entireties.

BACKGROUND

When scaling up Deep Neural Network (DNN) accelerators, a common memory bandwidth problem occurs. One approach to scaling the compute throughput of an accelerator is to increase the data parallelism by scaling the number of independent datapaths, each of which operates concurrently on different parts of the data (e.g., different rows in a matrix or different input vectors). However, if each of these datapaths must access data from a single logically unified memory structure, then the complexity of supporting an increasing number of independent accesses to that structure becomes prohibitively expensive.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One example implementation relates to a banked memory structure for use with an accelerator. The banked memory structure may include a plurality of local memory, wherein the plurality of local memory includes a memory decoder. The banked memory structure may include a plurality of computation units and a plurality of channels, wherein each channel of the plurality of channels is paired with a separate local memory of the plurality of local memory and one computation unit of the plurality of computation units; and wherein the memory decoder receives data for the accelerator, wherein the data includes a plurality of vectors and each vector of the plurality of vectors is assigned by the memory decoder to one channel of the plurality of channels for processing by the computation unit associated with the channel.

Another example implementation relates to performed by a memory decoder of an accelerator. The method may include receiving data for use with the accelerator. The method may include identifying a plurality of vectors for the data. The method may include identifying a plurality of local memory in the accelerator. The method may include for each vector of the plurality of vectors: selecting a separate local memory of the plurality of local memory for use with the vector; mapping an address of the separate local memory to the vector; and using the mapping to send the data for the vector to a data channel associated with the separate local memory.

Another example implementation relates to a device. The device may include one or more processors; memory in electronic communication with the one or more processors; and instructions stored in the memory, the instructions being executable by the one or more processors to: receive data for use with an accelerator; identify a plurality of vectors for the data; identify a plurality of local memory in the accelerator; for each vector of the plurality of vectors: select an separate local memory of the plurality of local memory for use with the vector; map an address of the separate local memory to the vector; and use the mapping to send the data for the vector to a data channel associated with the separate local memory.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which:

FIGS. 8A-8D illustrate visual representations of an example address generation and mapping of vectors into memory in accordance with some implementations of the present disclosure.

DETAILED DESCRIPTION

This disclosure generally relates to accelerators. When scaling up Deep Neural Network (DNN) accelerators, a common memory bandwidth problem occurs. One approach to scaling the compute throughput of an accelerator is to increase the data parallelism by scaling the number of independent datapaths, also referred to as channels, each of which operates concurrently on different parts of the data (e.g., different rows in a matrix or different input vectors). However, if each of these datapaths must access data from a single logically unified memory structure, then the complexity of supporting an increasing number of independent accesses to that structure becomes prohibitively expensive.

Figure 1:
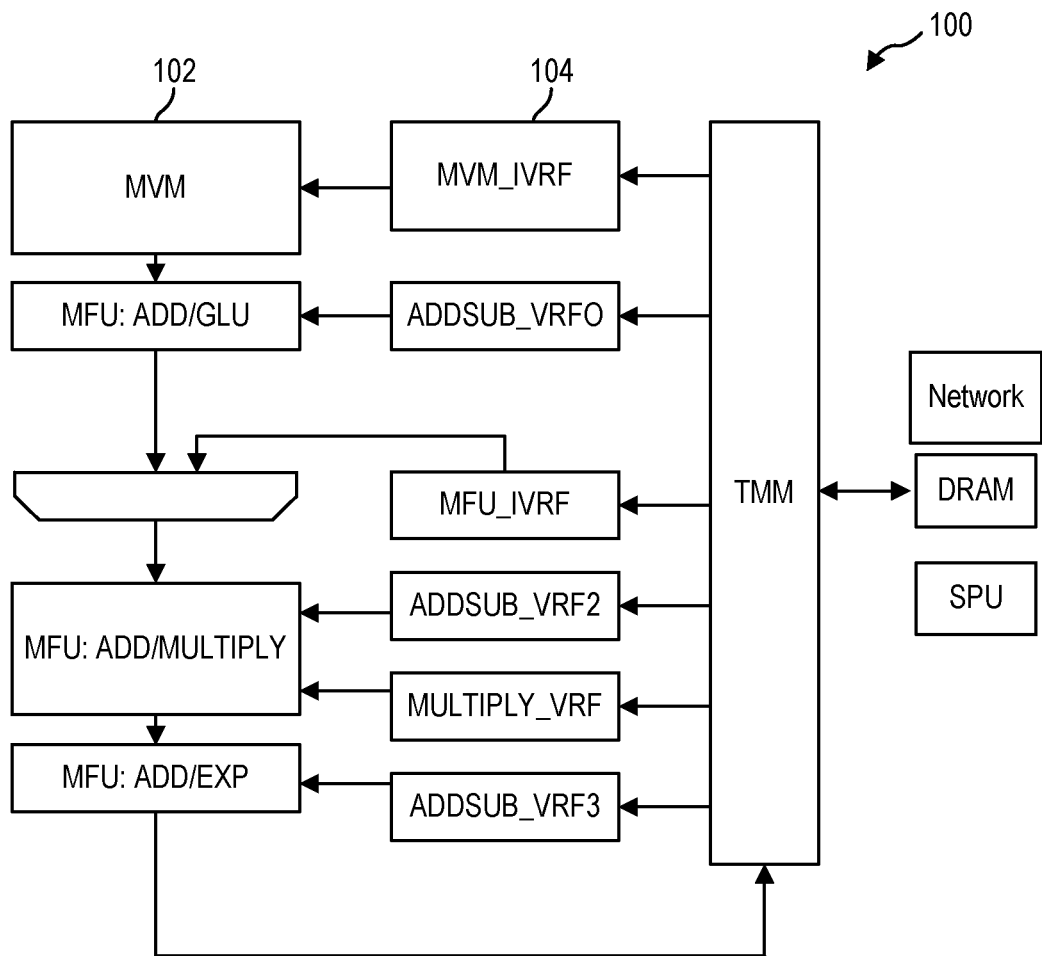
FIG. 1 illustrates an existing architecture for an accelerator.

FIG. 1 illustrates an existing architecture 100 for a DNN accelerator that includes a matrix-vector multiplier 102 datapath (e.g., MVM) connected to a single multi-ported vector-register-file 104 (e.g., MVM_IVRF). Architecture 100 reaches a memory bandwidth limitation when MVM datapath grows to have a higher peak throughput, such as, for example, in field programmable gate array (FPGA) devices. Thus, if datapaths are added to the existing accelerators to increase the throughput, the amount of resources needed for the increase in the datapath may increase quadratically for the addition of the datapath. As such, existing DNN accelerators have a scalability problem when trying to extend the hardware of the existing architecture.

Figure 2:
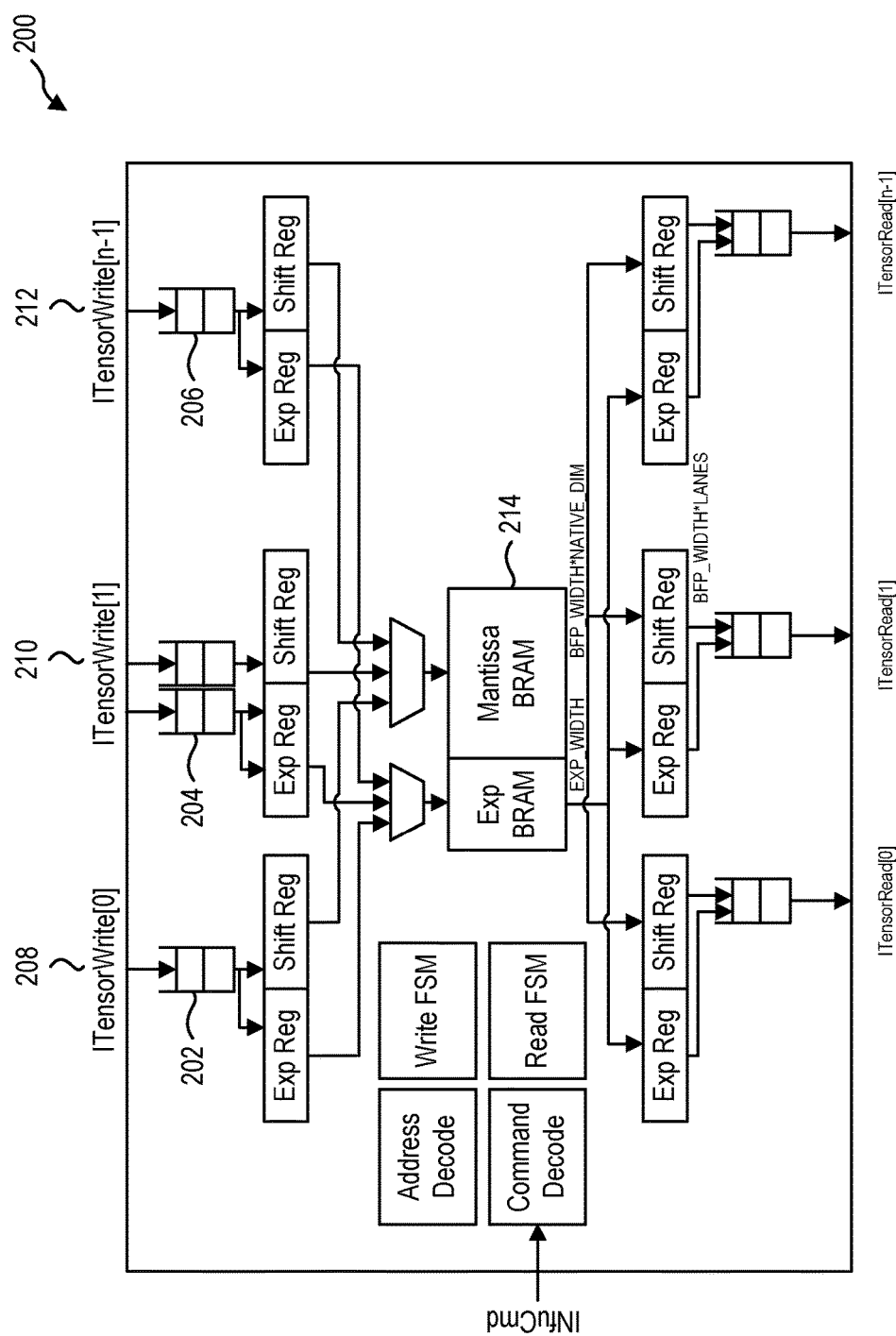
FIG. 2 illustrates an existing multiport vector register file (VRF) for use with an accelerator.

FIG. 2 illustrates an existing multiport VRF 200 for use with a DNN accelerator. Three channels 202, 204, 206 are illustrated for use with the multiport VRF 200. Each channel 202, 204, 206 has an individual datapath. In addition, each channel 202, 204, 206 has individual vectors 208, 210, 212 where data is coming into each of the channels 202, 204, 206. For example, the data may need to be written to the memory 214 or read from the memory 214. As such, each of the channels 202, 204, 206 may be filled from the data from this memory 214. Multiport VRF 200 may allow each of the channels 202, 204, 206 to access all of the memory 214 space. Supporting the independent accesses to the memory space becomes more complex as the number of channels increase.

Figure 3:
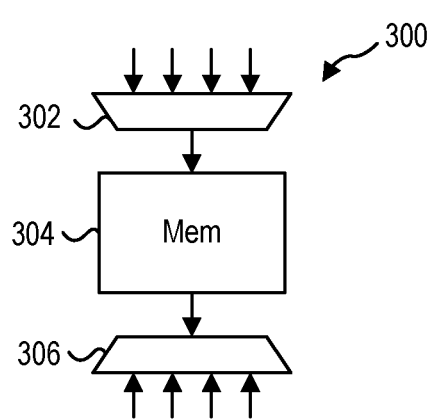
FIG. 3 illustrates hardware overhead for an existing multiport VRF for use with an accelerator.

FIG. 3 illustrates hardware overhead for an existing multiport VRF 300 for use with a DNN accelerator. Multiport VRFs 300 may have multiplexing 302 and/or demultiplexing 306 overhead, as illustrated. For example, multiported VRF 300 may grow hardware resource use quadratically because any data channel needs an access to any word in one shared register-file.

As such, the previous solutions illustrated in FIGS. 1-3 are typically very expensive in terms of area and power and limits the scalability of the solutions.

The devices and methods described herein may increase effective throughput of an accelerator by segmenting and isolating dataflows in datapath and memory. The devices and methods described herein provide each data channel with its own register memory bank, and thus, ensures that new addition of data channels increase not only datapath throughput, but also increase memory bandwidth so as to prevent memory bandwidth from being a bottleneck for the performance of the accelerator. This disclosure includes several practical applications that provide benefits and/or solve problems associated with improving memory in accelerators.

The devices and methods described herein may use a memory address decoder and distributed local memory structure that generates independent concurrently-executable memory access patterns and dataflows. As such, the devices and methods may have low cost in hardware implementations and may also keep a simple single-threaded programming model.

Previous multi-ported VRF typically grew hardware resources use quadratically because any data channel needs an access to any word in one shared register-file. The devices and methods described herein divide one memory space into multiple spaces. For example, if there are N channels, where N is an integer, the memory space is divided by N in order to split one register memory into multiple independent memory banks and to remove extra hardware overhead, such as, multiplexer, demultiplexer, and/or multi-port block RAM components.

A significant challenge in a banked memory architecture is how to map reference addresses to the independent memory banks such that the references from each data channel always map to the local memory. The devices and methods described herein use an efficient and straight-forward decoding scheme that assumes the data channels operate on independent iterations of a loop and automatically places the iteration-local variables in the proper memory bank.

One technical advantage of the devices and methods described herein is a low cost in structure and/or hardware implementations and consequent higher performance. The devices and methods ensure that the dataflows to parallelize are always confined in the own memory spaces of the dataflows without crossing, as such, the devices may be implemented as a straight-forward banked memory. Moreover, any control logic of one bank can be shared across all the banks since a dataflow from and/or to the first bank may represent the whole dataflows. In contrast, many existing DNN accelerators assign one contiguous chunk of memory space to local memory without taking full benefits in parallel dataflow when accessing memory, and thus, existing DNN accelerators have more expensive hardware to multiplex dataflows, de-multiplex dataflows, complex memory hierarchy and control logics, and/or complicated multi-threaded programming models.

Another technical advantage of the devices and methods described herein is scalability. Many existing accelerators have one physical memory address with a complex memory hierarchy (e.g., caches), which makes a cost of adding parallel datapaths more expensive than linear complexity. In comparison, the devices and methods described herein maintain localized data-in and/or out flows within distributed memory when executing operations. As such, the architecture of the devices may linearly scale with addition of a parallel datapath.

Figure 4:
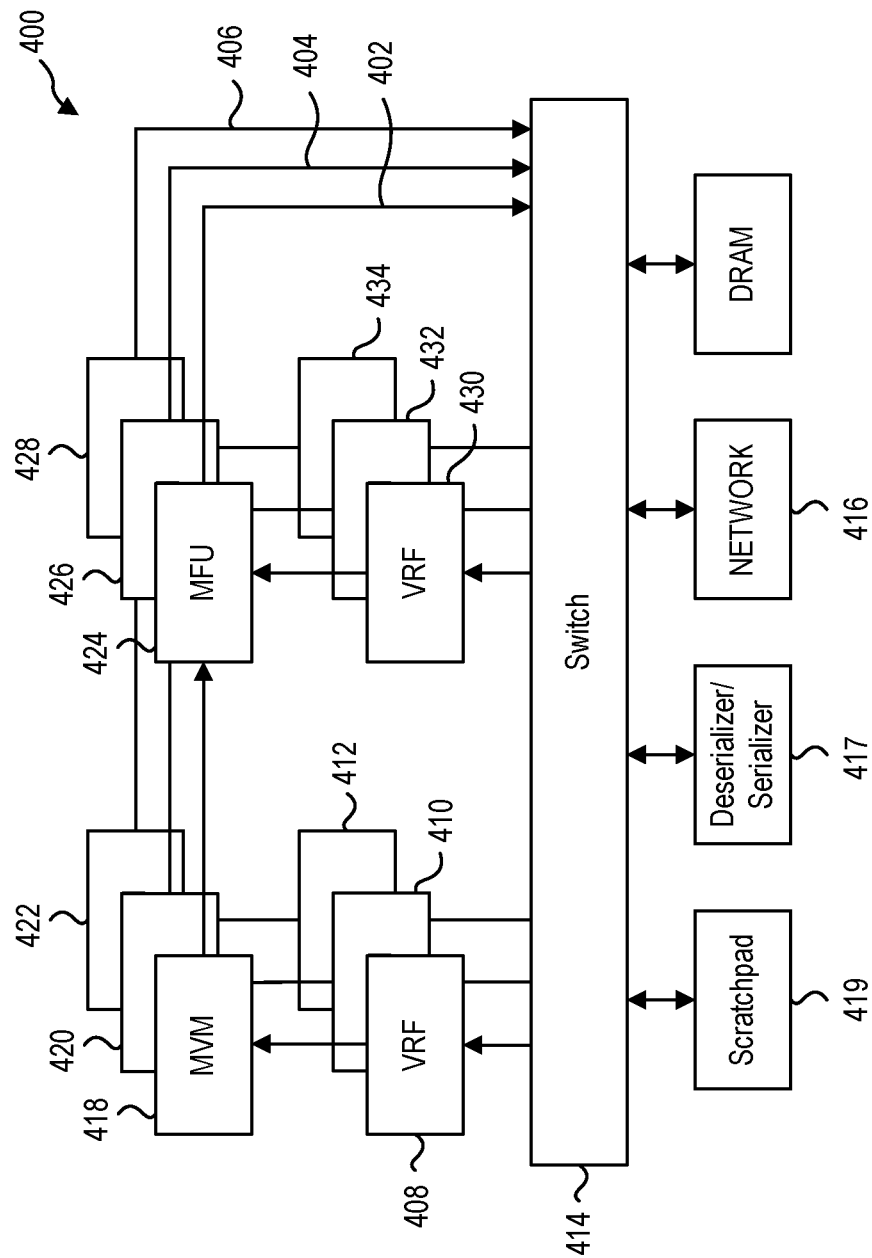
FIG. 4 illustrates an example banked memory architecture for an accelerator in accordance with some implementations of the present disclosure.

Referring now to FIG. 4, an example memory architecture 400 for an accelerator includes multiple data channels 402, 404, 406, where each data channel has a distinct or separate register memory bank 408, 410, 412, 430, 432, 434. In some implementations, architecture 400 is used with a DNN accelerator. Memory architecture 400 may use a banked memory structure with parallel data flows. Each data channel 402, 404, 406 (e.g., MVM and multifunction unit (MFU)) is paired with its own local register memory 408, 410, 412 (e.g., VRF) and the data flows independently through each VRF 408, 410, 412, 430, 432, 434, MVM 418, 420, 422, MFU 424, 426, 428, and Switch 414, without crossing into a different data channel 402, 404, 406. The data may be pushed to, or received from, the network 416 and may go through the different datapaths and operations may be performed in parallel without the data crossing into different datapaths. As such, data may remain in each individual datapath without crossing between different datapaths.

In some implementations, a scratchpad 419 is used to keep one of the register memories in the system as multi-ported to allow data to move across different channels. For example, the first VRF 408 may be set to a multiport VRF and may be used as a data shuffler. In other implementations, a deserializer/serializer 417 is included in switch 414 to allow the data to move across different channels. The multi-port VRF and/or the serializer 417 may be used to distribute input data to the different channels at the beginning and collect the output data at the end.

It should be noted that data movement across different channels happens only at the beginning and the end of the whole multiple chain operations that compose one deep learning layer, such as, a fully-connected layer or layer-normalization layer, and thus, the cost is amortized over multiple chain operations and almost hidden.

By providing each channel with a separate or distinct register memory bank, the new addition of data channels increases not only the datapath throughput, but also increases the memory bandwidth to prevent memory bandwidth from being a bottleneck for the performance.

Figure 5:
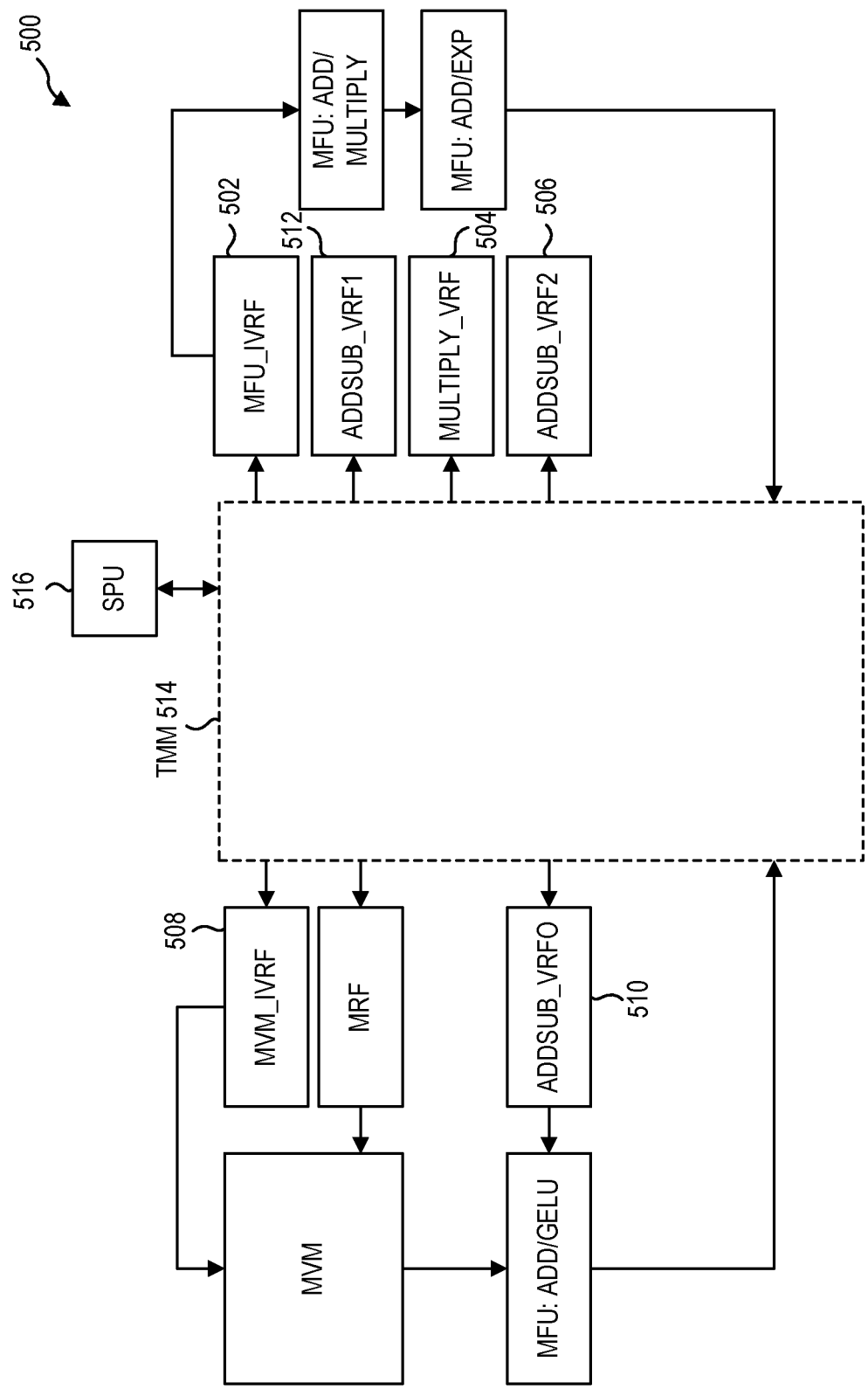
FIG. 5 illustrates an example architecture for an accelerator in accordance with some implementations of the present disclosure.

Referring now to FIG. 5, an example architecture 500 for an accelerator may include a Tensor Memory Manager (TMM) 514, a plurality of banked VRFs 502, 504, 506, one multiport VRE 508 that allows data to cross the channels, and single port VRFs 510, 512. For example, some constants, such as, layerNorm weight/bias vectors, need to be copied to all memory banks and the constants broadcast across all channels using one or more of the single port VRFs 510, 512. In some implementations, architecture 500 is used with a DNN accelerator.

The banked memory structure of architecture 500 may be connected to parallel computation units (e.g., MVM_IVRF 508, MFU_IVRF 502, and/or SPU 516) without any mechanism for a computation unit to access data in any other memory bank other than the locally connected memory bank to the computation unit (e.g., no crossbar, rotation unit, or other inter-bank interconnection network).

In some implementations, a memory decoder is included in the banked VRFs and configured to decode the memory addresses for the vectors and map the vectors into the different memory banks. The memory decoder may select the vectors and may select the channels to place the vectors into. The memory decoder may use a memory address policy or an addressing scheme that enables the parallel computation units (e.g., MVM_IVRF 508, MFU_IVRF 502, and/or SPU 516) to work closely together to parallelize a computation at a fine granularity (e.g., individual loop iterations). For example, the memory decoder may use a single threaded program code as the memory address policy for decoding the memory addresses for the vectors and mapping the vectors into different memory banks.

A serializer may be placed in a switch to allow data movement across different channels. In some implementations, a scratchpad is used to keep one of the register memories in the system as multi-ported to allow data to move across different channels. The serializer and/or the multi-port VRF may be used to distribute input data to the different channels at the beginning and collect the output data at the end. Data movement across different channels may happen at the beginning and/or the end of the whole multiple chain operations that compose one deep learning layer, such as, a fully-connected layer or layer-normalization layer. As such, the cost of the data moving across different channels may be amortized over multiple chain operations and almost hidden. For example, the cost is negligible when accelerating transformer based models, such as bidirectional encoder representations from transformers (BERT).

As a simplified example use case for use with architecture 500, consider the evaluation of the following expression:

$$D = A + B \times C$$

where all the values (A, B, C, D) are 6×4 matrices and all of the operations are performed element-wise. Further, assume that each data channel operates on a variable-length vector of elements. In addition, each matrix is treated as a group of four-element vectors and architecture 500 may enable up to 6 channels to operate concurrently on these vectors (one row per channel). If all the data is stored in a logically unified memory, there will be significant expense and complexity in enabling all 6 channels to read concurrently from that memory. However, using architecture 500 with banked memory, each channel can operate on its own slice of each matrix independently. By setting "tiles" to 4 and "iterations" to 6, architecture 500 may spread the 6 iterations out across the available channels (e.g., reusing channels if the available channels are less than 6), and map the elements 4 at a time to each channel. Thus, the row(s) that each channel needs to access will be found in its local memory bank. The native data type in this example on which each channel operates and which is stored in each memory location is a vector of values (typically 128), so setting "tiles" to 4 represents a vector of 512 values.

Thus, architecture 500 may deliver better performance and may linearly scale with addition of a parallel datapath.

Figure 6:
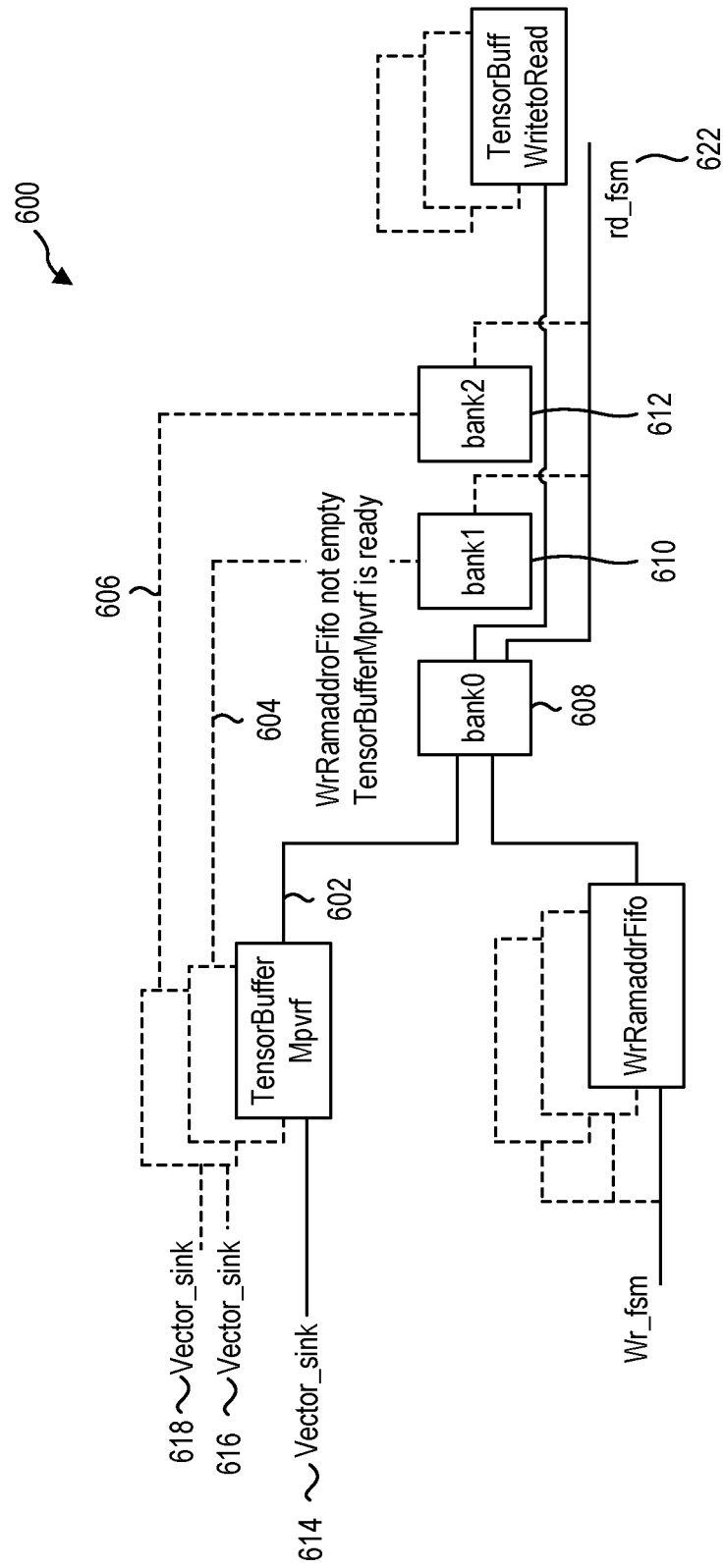
FIG. 6 illustrates an example multi-bank VRF for use with an accelerator in accordance with some implementations of the present disclosure.

Referring now to FIG. 6, an example multi-bank VRF 600 for use with architectures 400 or 500 may include three channels 602, 604, 606, where each channel 602, 604, 606 is tied to separate or distinct local memory 608, 610, 612. Each channel 602, 604, 606 has individual vectors 614, 616, 618 where data is coming into each of the channels 602, 604, 606. For example, the data may need to be written to the memory 608, 610, 612 or read from the memory 608, 610, 612. Multi-bank VRF 600 may split one register memory into multiple independent memory banks 608, 610, 612 and may remove extra hardware overhead, such as, but not limited to, multiplexer/demultiplexer or multi-port block RAM component. As such, multi-bank VRF 600 may not need to pay for the additional hardware for multiplexing and/or demultiplexing.

A memory decoder may be included in the multi-banked VRF 600 and configured to decode the memory addresses for the vectors 614, 616, 618 and map the vectors 614, 616, 618 into the different memory banks 608, 610, 612. The memory decoder may select the vectors 614, 616, 618 and may select the channels 602, 604, 606 to place the vectors 614, 616, 618 into. Multi-bank VRF 600 does not allow the data to cross the different memory banks 608, 610, 612. In an implementation, the memory decoder is the shared read/write control signals (Wf_fsm 620, rd_fsm 622) across the memory banks 608, 610, 612. The memory decoder uses a straight-forward decoding scheme using the shared read/write control signals to perform the memory address decoding without adding extra complexity to the multi-banked VRF 600. As such, multi-bank VRF eliminates the multiplexer/demultiplexer state, and thus, saves resources.

Figure 7:
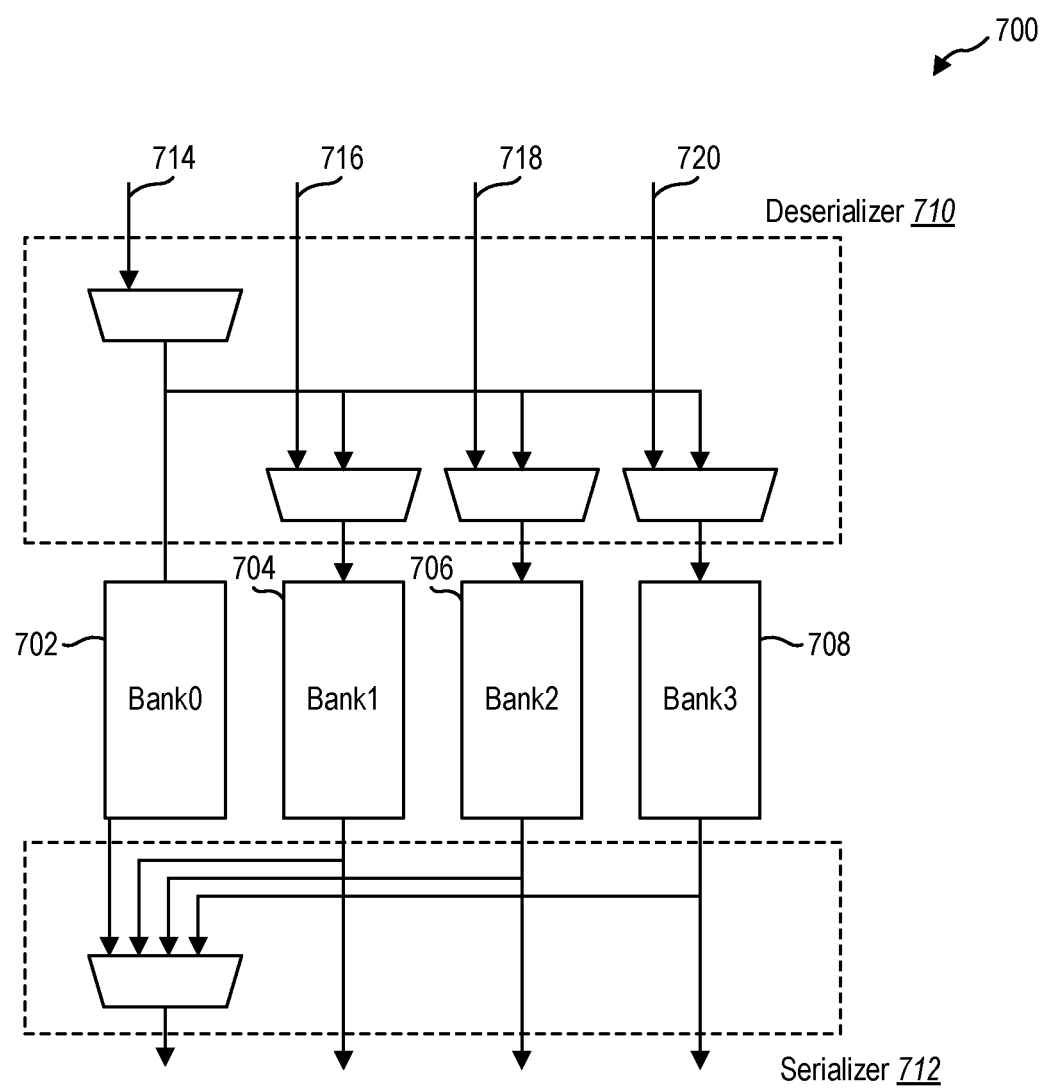
FIG. 7 illustrates an example multi-bank VRF for use with an accelerator in accordance with some implementations of the present disclosure.

Referring now to FIG. 7, an example multi-bank VRF 700 for use with architectures 400 or 500 may divide one memory space into multiple spaces. For example, if there are N channels, where N is an integer, the memory space of multi-bank 700 is divided by N. In the illustrated example, N may be four and multi-bank VRF 700 may split the memory space into four different memory banks 702, 704, 706, 708. Each memory bank 702, 704, 706, 708 has an associated channel 714, 716, 718, 720 that receives data for each memory bank 702, 704, 706, 708.

In some implementations, multi-bank VRF 700 includes a deserializer 710 and a serializer 712 inside the multi-bank VRF 700. The deserializer 710 may distribute an incoming data stream for the multi-bank VRF 700 across the memory banks 702, 704, 706, 708. For example, the deserializer 710 may distribute input data to the different channels 714, 716, 718, 720 of the memory banks 702, 704, 706, 708. The serializer 712 may access all the different memory banks 702, 704, 706, 708 and may collect the output data at the end from the different memory banks 702, 704, 706, 708 into one single data stream. By having the deserializer 710 and the serializer 712 embedded within the multi-bank VRF 700, data may move across the data channels 714, 716, 718, 720 and multi-bank VRF 700 eliminates the constraints on crossing memory banks. Thus, multi-bank VRF 700 may be used for data values that may require communication across memory banks.

Figure 8A:
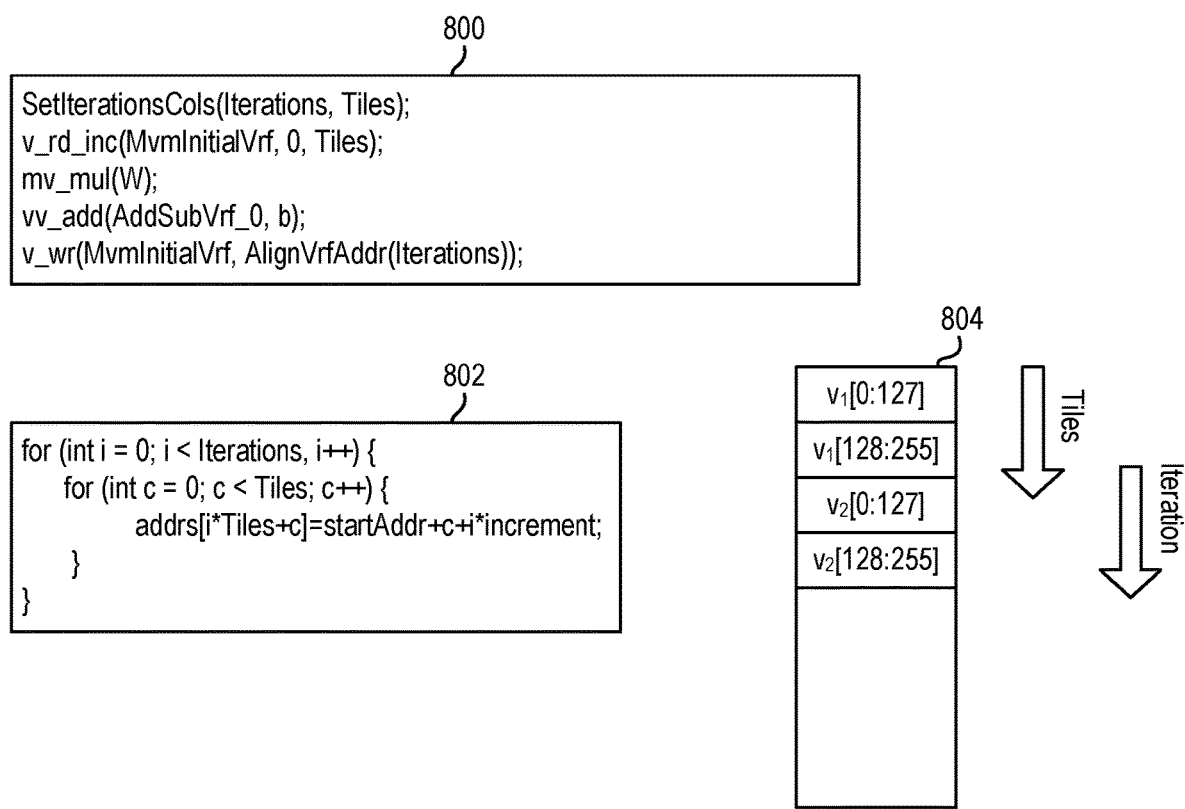

Referring now to FIG. 8A, illustrated is a visual representation of an example address generation and mapping of a vector into memory for a one dimensional memory access pattern. The one dimensional memory access pattern may be used, for example, with a multiport VRF 508. When a multiport VRF is used, from the point of view of the programmer, one memory chunk is available.

Program code 800 may set the iteration numbers and may express the number of the vectors and the value of the vector. The number of tiles indicate the size of the vector. The number of iterations indicate the number of vectors from the memory and the datapaths.

Program code 802 illustrates an example loop that streams the data into the accelerators from the network, pushes the data into the processing so that the data is either written into memory or read from memory, and takes the data back out to the network. Memory mapping 804 illustrates a one dimensional memory access pattern in a single flat memory space using the loop illustrated in program code 802.

One example use case may include 16 vectors with a vector size of 256. The program code 802 may set the iteration to 16, the number of vectors in this example. The tile size of the vectors may be set to a size of 128. In this example, the vector tile size may be 2 since the vector size is 256 and the tile size is set to 128. The tile index may indicate the vector number and the tile size.

In the illustrated example, memory mapping 804 may include the tile index, V1 (0:127) and V1 (128:255), for the first vector and the tile index, V2 (0:127) and V2 (128:255), for the second vector. While only two vectors are illustrated in the example, the loop of program code 802 may progress through the 16 vectors and all 16 vectors may be mapped for memory access. As such, memory mapping 804 may continue to update with the tile indexes for the remaining vectors.

Figure 8B:
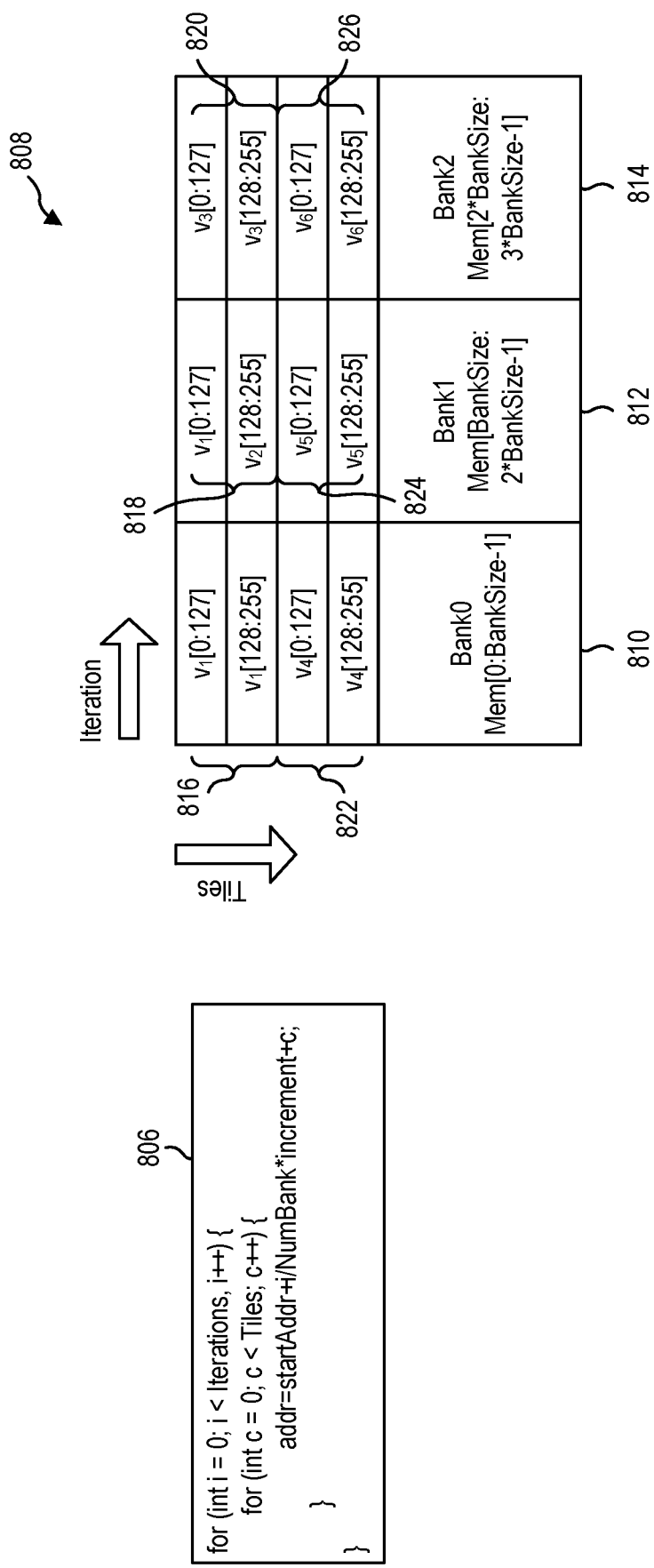

FIG. 8B is a visual representation of an example address generation and mapping of vectors into memory for a two dimensional memory access pattern. The two dimensional memory access pattern may be used by architectures 400 or 500 with banked memories. Program code 806 may use a straight-forward single-threaded programming model for mapping the vectors into different memory addresses of the available memory banks. The number of tiles indicate the size of the vector. The number of iterations indicate the number of vectors from the memory and the datapaths.

Program code 806 illustrates an example loop that streams the data into an accelerator from the network, pushes the data into the processing so that the data is either written into one or more of the memory banks or read from one or more of the memory banks, and takes the data back out to the network. Memory mapping 808 illustrates a two dimensional memory access pattern for a banked memory architecture using the loop illustrated in program code 806. The tile index for each vector may indicate the vector number and the tile size. In addition, the tile index may be used to map the vectors to the local memory in the different memory banks.

A memory decoder for use with architectures 400 or 500 of DNN accelerator may use the loop for decoding the memory addresses for the vectors 816, 818, 820, 822, 824, 826 and mapping the vectors 816, 818, 820, 822, 824, 826 into the different memory banks 810, 812, 814. The memory decoder may select the vectors and may select the channels to place the vectors into. The tile index for each vector may map the vector tiles to the selected channel for the memory bank. The memory decoder may keep each ith-iteration of the dataflow loop in one specified memory bank 810, 812, 814, and thus, allows parallel chains to run through multiple memory banks 810, 812, 814. As such, each of the vector tiles may remain within the same channel and data crossing between the channels may not occur.

Program code 806 may provide an efficient and straight-forward decoding scheme that assumes the data channels operate on independent iterations of a loop and the memory decoder may use program code 806 to automatically places the iteration-local variables in the proper memory bank. Program code 806 may be written using a single-threaded program model where the programmer provides additional information to identify parallel loops. First, the iteration counter is set to a total number of iterations to process and the tiles is set to the size of vector to process (in multiplies of the hardware native vector size). Then, the memory locations for a given array of vectors is striped across the banks in units of tiles native vector entries. The read/write addresses on the first bank memory can be used by all the banks (shown as "Tiles" y-axis) as iterations are distributed across different data channels (shown as "Iteration" x-axis).

One example use case may include 16 vectors with a vector size of 256. The program code 806 may set the iteration to 16, the number of vectors in this example. The tile size of the vectors may be set to a size of 128. In this example, the vector tile size may be 2 since the vector size is 256 and the tile size is set to 128. The tile index may indicate the vector number and the tile size.

The memory decoder may select the first vector 816 for memory bank 810 and may place both tiles for the first vector 816 into memory bank 810. Memory mapping 808 illustrates the tile index, V1 (0:127) and V1 (128:255), for the first vector 816 mapped to memory bank 810.

The memory decoder may select the second vector 818 for memory bank 812 and may place both tiles for the second vector 818 into memory bank 812. Memory mapping 808 illustrates the tile index, V2 (0:127) and V2 (128:255), for the second vector 818 mapped to memory bank 812.

The memory decoder may select the third vector 820 for memory bank 814 and may place both tiles for the third vector 820 into memory bank 814. Memory mapping 808 illustrates the tile index, V3 (0:127) and V3 (128:255), for the third vector 820 mapped to memory bank 814.

The memory decoder may select the fourth vector 822 for memory bank 810 and may place both tiles for the fourth vector 822 into memory bank 810. Since the number of memory banks is less than the number of vectors, memory decoder may reuse available memory banks for the remaining vectors. Memory mapping 808 illustrates the tile index, V4 (0:127) and V4 (128:255), for the fourth vector 822 mapped to memory bank 810.

The memory decoder may select the fifth vector 824 for memory bank 812 and may place both tiles for the fifth vector 824 into memory bank 812. Memory mapping 808 illustrates the tile index, V5 (0:127) and V5 (128:255), for the fifth vector 824 mapped to memory bank 812.

The memory decoder may select the sixth vector 826 for memory bank 814 and may place both tiles for the sixth vector 826 into memory bank 814. Memory mapping 808 illustrates the tile index, V6 (0:127) and V6 (128:255), for the sixth vector 826 mapped to memory bank 814.

While only six vectors are illustrated, the memory decoder may continue for each iteration of loop to place vectors into different memory banks 810, 812, 814 until the total number of vectors have been placed into memory banks 810, 812, 814. For this example, the memory decoder may continue to place the vectors for each iteration of the loop sequentially until all sixteen vectors are placed in the memory banks 810, 812, 814.

In some implementations, the memory decoder assigns the vectors to the different memory banks sequentially to ensure that instructions execute sequentially in the DNN accelerator. In addition, the memory decoder may ensure that base addresses start indexing starts from the first memory bank. As such, the memory decoder may start with a first memory bank and move sequentially to a next memory bank when assigning the vectors to the different memory banks. One example equation that memory decoder may use is illustrated in equation (1)

$$\text{range}=[\text{base\_adr},\text{base\_adr}+(\text{\# of iter})/\text{channels}*\text{tileCols}] \quad (1)$$

where the # of iter is the number of iterations, the tileCols is the size of the vector, the channels is equal to the number of available channels, and the base address is the memory address of the first memory bank in the accelerator.

FIG. 8C illustrates two code examples for use with memory mapping that perform the same operation and give the same result. Program code 828 may not include multiple iterations. For example, in program code 828, N number of iterations, where N is an integer, is set from SetIterationsCols( ) instruction.

Program code 830 may include multiple iterations and may be used by the memory decoder for use with architectures 400 or 500. As such, the memory decoder can use the information for the number of iterations from the program code 830 for maximizing parallelism. In some implementations, the memory decoder automatically determines N dataflows, where N is an integer greater than 1 using program code 830 and runs the N dataflows in parallel. The memory decoder divides dataflows into the number of channels groups, which is equal to the number of available memory banks in architectures 400 or 500 and isolates the dataflows in multiple memory banks to run the dataflows concurrently.

The logical programmer view is that when there are multiple loop iterations that go through the same set of operations in a program, data vectors and their dataflows are automatically distributed across banks. The programmer can index them as group by memory address in the First bank.

Referring now to FIG. 8D, illustrated is a visual representation of an example address generation and a mapping of the vectors for three consecutive chains and the memory access patterns. The memory access patterns may be used by architectures 400 or 500 with banked memories. For example, architectures 400 or 500 may have three channels and three available memory banks.

The illustrated consecutive chains in the different program codes 832, 834, 836 may have the same number of code lines but different iteration numbers and different sizes of tiles. The memory mappings 838, 840, 842 illustrate the different memory access patterns for the different chains. For example, Memory mapping 838 illustrates the tile index for the vectors from the first chain of program code 832, memory mapping 840 illustrates the tile index for the vectors from the second chain of program code 834, and memory mapping 842 illustrates the tile index for the vectors from the third chain of program code 836.

The memory decoder may select all available memory banks or a subset of the available memory banks for use when partitioning the data. For example, the number of vectors for the first chain and the second chain may be multiple of the number of available memory banks, and thus, the memory decoder may use all available memory banks when partitioning the vectors for the first chain and the second chain.

Another example is where the number of vectors for the third chain is not a multiple of the available memory banks. For example, there may be three available memory banks and four vectors in the third chain, and thus, the fourth vector may be remaining after the first three vectors are provided to the three available memory banks. Memory decoder may use a subset of the available memory banks for the remaining fourth vector. For example, memory decoder may place the fourth vector in the first memory bank. Memory decoder may keep the vector tiles for the fourth vector (e.g., three vector tiles) together in the first memory bank to prevent data from the fourth vector from crossing into a different channel or memory bank. As such, the data may stay within the memory banks that the vectors are operating within.

Figure 9:
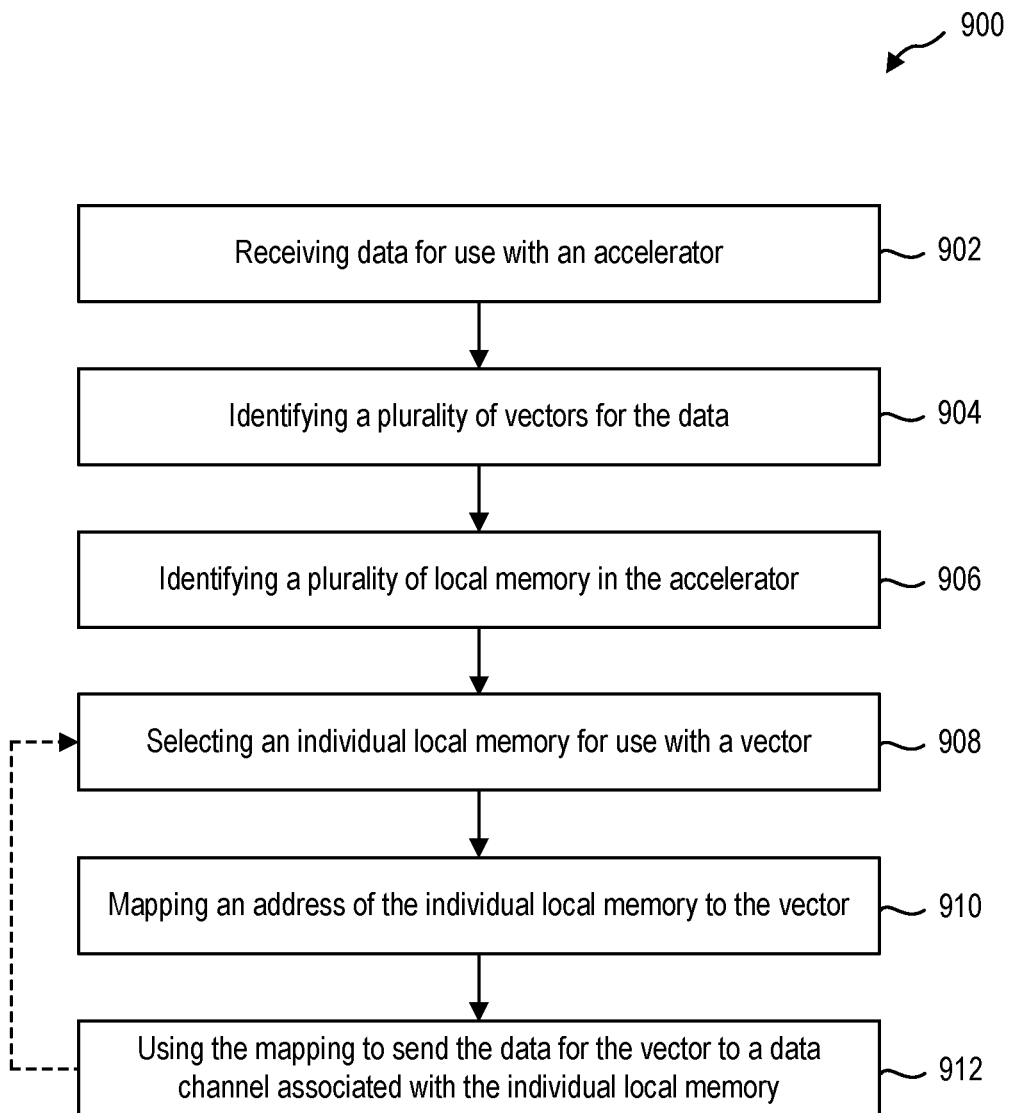
FIG. 9 illustrates an example method for mapping reference addresses to independent memory banks in accordance with some implementations of the present disclosure.

Referring now to FIG. 9, a method 900 for mapping reference addresses to independent memory banks may be performed by a memory decoder of an accelerator. In an implementation, the memory decoder is the shared read/write control signals (Wf_fsm 620, rd_fsm 622) across the memory banks 608, 610, 612. The memory decoder may perform one or more actions of method 900. The actions of method 900 may be discussed below with reference to the architecture of FIGS. 4-7.

At 902, method 900 includes receiving data for use with an accelerator. The data may be pushed or received from a network 416. The memory decoder may receive the data streams from the network 416 for the accelerator and may push the data into processing so that the data is either written into memory or read from memory. In one implementation, the accelerator is a deep neural network (DNN) accelerator.

At 904, method 900 includes identifying a plurality of vectors 618, 616, 614 for the data. The memory decoder may identify a plurality of vectors 618, 616, 614 for the data using a program code. For example, the program code may express the number of the vectors and the value of the vector and may set the iteration numbers. The number of iterations indicate the number of vectors from the memory and the datapaths. In addition, the number of tiles indicate the size of the vector. In an implementation, the program code is a single threaded program code.

At 906, method 900 includes identifying a plurality of local memory 608, 610, 612 in the accelerator. For example, the memory decoder may identify the plurality of local memory 608, 610, 612 in the accelerator. The plurality of local memory may include a banked memory architecture with a plurality of local memory. The local memory may include a vector register file (VRF). In addition, each separate or distinct local memory of the plurality of local memory may be accessed for independent concurrently executable memory access patterns.

At 908, method 900 includes selecting a separate local memory for use with a vector. The memory decoder may select a separate local memory for use with a vector. For example, the memory decoder may select the separate local memory in a sequential order of the plurality of local memory to ensure that instructions execute sequentially in the accelerator. The memory decoder may ensure that base addresses starts indexing from the first separate local memory and moves sequentially to a next separate local memory when selecting the separate local memory for use with a vector. The memory decoder may select all available local memory or a subset of the local memory for use when partitioning the data.

At 910, method 900 includes mapping an address of the separate local memory to the vector. The memory decoder may map an address of the separate local memory to the vector. For example, the memory decoder may identify a number of tiles for the vector based on a vector size for the vector and may provide a tile index for each tile of the vector for use with mapping the address of the separate local memory to the vector. The tile index for each vector may map the vector tiles to the selected channel for the memory bank.

At 912, method 900 may include using the mapping to send the data for the vector to a data channel 602, 604, 606 associated with the separate local memory. For example, the memory decoder may use the mapping to partition the data and send the data for the vector to a data channel associated with the separate local memory. The memory decoder may keep each ith-iteration of the dataflow loop in one specified memory bank, and thus, allows parallel chains to run through multiple memory banks. Each tile of the vector may remain in the data channel associated with the separate local memory. As such, each of the vector tiles may remain within the same channel and data crossing between the channels may not occur. The memory decoder may use the program code to automatically places the iteration-local variables in the proper memory bank.

Each separate or distinct local memory may be associated with a computation unit that performs processing on the data for the separate or distinct local memory. The computation unit may be unable to access data in any other memory bank other than the locally connected memory bank to the computation unit. As such, the plurality of computation units for each of the separate or distinct local memory performs processing of the data in parallel and works together to parallelize a computation at a fine granularity (e.g., individual loop iterations).

Method 900 may return to 908 and repeat until all the vectors are mapped to a separate local memory. As such, method 900 may be used to provide fine-grain parallelization of the data by partitioning the data at each iteration of method 900.

Figure 10:
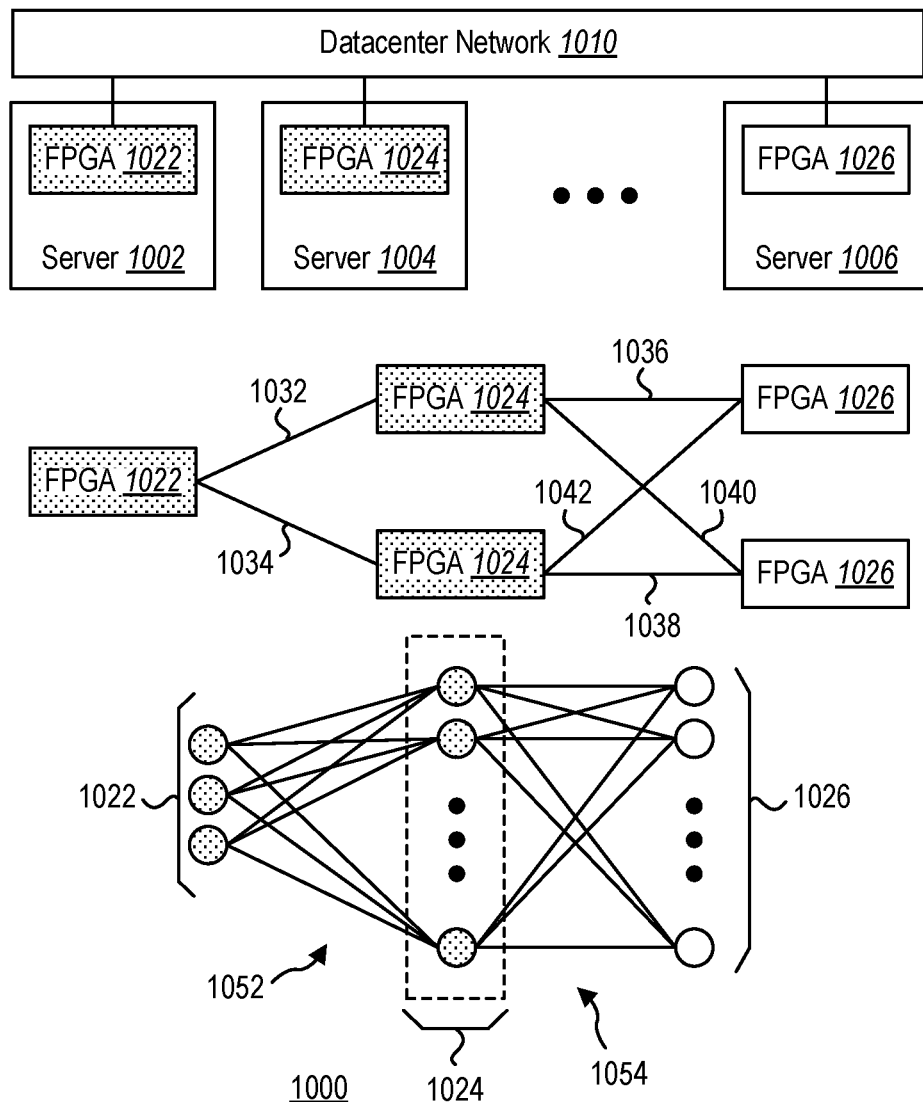
FIG. 10 illustrates a block diagram of a system including nodes interconnected via a datacenter network for use with an accelerator in accordance with some implementations.

FIG. 10 is a block diagram of a system 1000 including nodes interconnected via a datacenter network 1010 in accordance with one example. For example, as shown in FIG. 10, multiple nodes 1002, 1004, and 1006 may be coupled via the datacenter network. Such nodes may be instantiated and used to parallelize multiple layers of a neural network, such as a Long Short Term Memory (LSTM) network. In one example, each node is implemented as a server and may further include at least one hardware node (e.g., an FPGA.) Thus, node 1002 may include FPGA 1022, node 1004 may include FPGA 1024, and node 1006 may include FPGA 1026. The FPGAs may be interconnected via a light transport layer protocol based system. In one example, a first instance of FPGA 1022 is coupled via a transport link 1032 with a first instance of FPGA 1024 and the first instance of FPGA 1022 may further be coupled via transport link 1034 with the second instance of FPGA 1024. The first instance of FPGA 1024 may be coupled via a transport link 1036 with a first instance of FPGA 1026 and the first instance of FPGA 1024 may further be coupled via transport link 1040 with a first instance of FPGA 1026. Similarly, the second instance of FPGA 1024 may be coupled via a transport link 1042 with the first instance of FPGA 1026 and the second instance of FPGA 1024 may further be coupled via a transport link 1038 with the second instance of FPGA 1026. The light transport layer protocol may provide the FPGAs with the ability to transfer or receive packets or other such data from each other via datacenter network 1010. The FPGAs may be interconnected in other configurations as well. For example, several instances of FPGA 1022 may be coupled via multiple transport links 1052 to several instances of FPGA 1024. Similarly, several instances of FPGA 1024 may be coupled via transport links 1054 to several instances of FPGA 1026. Although FIG. 10 shows a certain number and arrangement of nodes, including FPGAs, there could be more, or fewer number of nodes arranged differently.

Figure 11:
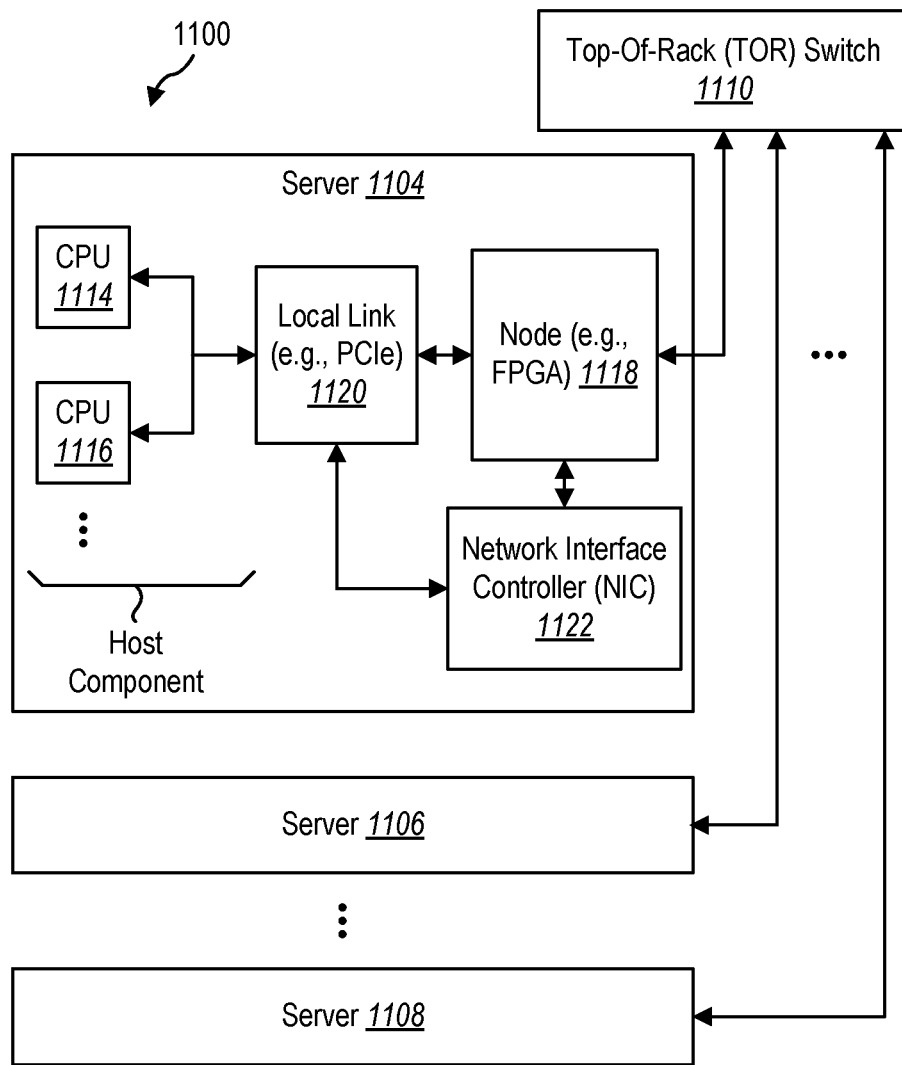
FIG. 11 illustrates a block diagram of a system including distributed nodes for use with an accelerator in accordance with some implementations.

FIG. 11 is a block diagram of a system 1100 including distributed nodes in accordance with one example. In this example, the multiple nodes are implemented as a rack of servers in a datacenter. Each of the servers can be coupled to a top-of-rack (TOR) switch. Other racks, although not shown, may have a similar configuration. Each server may include at least one node or multiple nodes. Each node may include a server (e.g., server 1104, server 1106, or server 1108) and each server may be coupled to a TOR switch (e.g., TOR switch 1110). Server 1104 may include a host component including central processing unit (CPU)s, such as CPU 1114 and CPU 1116, which may be coupled via a local link (e.g., PCIe) 1120 to a hardware node, e.g., FPGA 1118. Each hardware node may also be coupled by way of a network interface controller 1122 (e.g., used to communicate across the network infrastructure for the data center). The system shown in FIG. 11 may allow nodes to perform processing on messages that are received from (and/or sent to) TOR switch or other switches. Using this example system, individual nodes may send messages comprising packets directly to each other and thus this may allow the partitioning of even a single neural network across multiple FPGAs without incurring unacceptable latencies. For communicating the nodes may use a lightweight protocol, including, for example, RDMA. Although FIG. 11 shows a certain number of components of the system arranged in a certain manner, there could be more, or fewer number of components arranged differently.

Parallelization could also be performed within a layer of a neural network by splitting neural weights across multiple nodes. As an example, a single Recurrent Neural Network (RNN) model (e.g., including LSTM weight matrices) may be partitioned and pinned across multiple nodes. In an implementation of this example, a RNN model may be distributed across the memories (e.g., BRAMs) of each of multiple FPGAs. In this example configuration, each individual FPGA in a multi-stage pipeline may store a fraction of the LSTM weight matrices in a fast on-chip memory (e.g., BRAM). This may advantageously result in a high throughput and yet a low-latency system. At the service start up, the LSTM weight matrices may be decomposed into certain size matrices (e.g., an N by M matrix, where each of N and M is an integer equal to or greater than 8) and then be loaded into the on-chip memories of the FPGAs. A run-time management layer may enable allocation, scheduling, and management of the FPGAs. In one example, each node may be implemented as a HaaS-attached LSTM-focused vector processor based on one or more FPGAs. Each node may be designed to run neural network evaluations as either as a PCIe-attached FPGA or as part of a HaaS pool of FPGAs.

Figure 12:
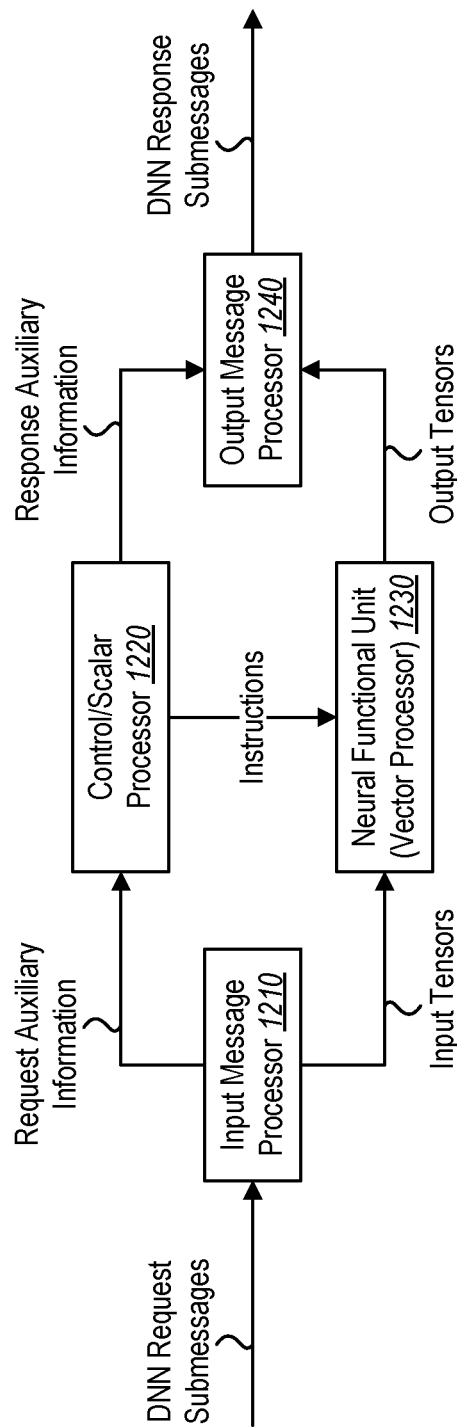
FIG. 12 illustrates a block diagram of a hardware node for use with an accelerator in accordance with some implementations.

FIG. 12 is a block diagram of a hardware node 1200 in accordance with one example. Each hardware node 1200 may include an Input Message Processor (IMP) 1210 for receiving messages from other nodes and an Output Message Processor (OMP) 1240 for processing outgoing message to other nodes or components. Each node may further include control/scalar processor (CSP) 1220 and a neural functional unit (NFU) 1230. Although not shown, the received messages received by a node may be stored in at least two different queues: (1) IMP-to-CSP Auxiliary Queue and (2) IMP-to-NFU Data Queue. Although not shown, the outgoing messages may be stored in at least two different queues: (1) CSP-to-IMP Auxiliary Queue and (2) NFU-to-OMP Data Queue. In this example, the node may accept off-chip messages containing both auxiliary information such as control and scalar data and payload data (e.g., vectors, matrices, or other tensor data structures). The auxiliary information may include a request to perform computationally intensive operations on the payload, and then return a result in the form of an output message. In this example, the incoming messages are handled by a lightweight input message processor (IMP) 1210, which sends auxiliary information to control/scalar processor (CSP) 1220 (which may be a NIOS-based control processor) and payload data (e.g., input tensors) to neural functional unit (NFU) 1230, which may be implemented as a matrix-vector processor. As an example, CSP 1220 may then interpret the request, and based on its firmware, may send a series of instructions to NFU 1230. After a certain processing latency, the NFU may produce the result of the request, which may be combined with auxiliary data produced by CSP 1220 in a lightweight output message processor (OMP) 1240 and then sent off-chip. CSP firmware may provide instructions to NFU 1230. Further details of the example instructions are discussed as part of the instruction set architecture (ISA). Run-time reloading of the firmware for CSP 1220 may also be performed. Thus, in this example, the architecture is largely event driven. The input messages may arrive from many sources (including over the network). IMP may examine the head of the queue of the messages and it can dequeue any instructions that need to be performed and feed it through the system. Although FIG. 12 shows a certain number of components of the example node arranged in a certain manner, there could be more, or fewer number of components arranged differently.

In one example, the NFU is implemented as a matrix-vector processor designed to scale up to the majority of the FPGA's resources. In this example, the primary hardware acceleration goal of the NFU is to perform matrix-vector multiplications at high throughput and low latency with its matrix-vector unit (MVU) by applying thousands of multiply-adders. The NFU may receive matrices of coefficients (e.g., constants) and may be used for multiplying these coefficients with the dynamic input vector data. Thus, instead of storing the coefficients in a dynamic random-access memory (DRAM) corresponding to a CPU/graphics processing unit (GPU), the coefficients may be pre-loaded at the service startup time into the on-chip memories (e.g., block random access memories (BRAMs) of FPGAs) corresponding to the NFU. In one example, the coefficients once loaded may never be re-loaded again unless the neural network model being used is modified or the service is restarted. As part of this example, the model may be partitioned and pinned in a distributed manner to the on-chip memories of multiple nodes (e.g., FPGAs) connected in a manner that they can transfer messages or packets to each other directly without relying upon assistance from CPU resources.

In one example, the MVU is fully pipelined and capable of performing an $O(n^2)$ complexity matrix-vector multiplication in $O(n)$ time, at a performance of 400-1800 billion fixed point operations per second. While matrix-vector multiplications may represent the vast majority of the fixed-point operations required to evaluate an LSTM layer, the evaluation can also contain a variety of vector reductions, transcendentals, and the addition of bias vectors. The NFU may also implement pipelined multifunction units (MFUs) to handle these $O(n)$ complexity vector functions in $O(n)$ time. These MFUs may be organized into a chain architecture, with the MVU passing data to the first MFU, the first MFU passing data to the second MFU, and so on. In one example implementation of the NFU, 1 MVU and 5 MFUs may be used.

The chain architecture may allow the NFU to exploit massive pipeline parallelism between a single matrix-vector multiplication and several vector functions, based on the observation that vector functions could potentially dominate LSTM evaluation time in an architecture where vector and matrix-vector operations take approximately the same amount of time to compute. The NFU's memory subsystem may also be configured to support high throughput. As an example, the memory subsystem may support up to 1.8 TB/s of matrix value throughput along with support for loading 6 vectors and storing 6 vectors simultaneously.

The techniques described herein may be implemented in hardware, software, firmware, or any combination thereof, unless specifically described as being implemented in a specific manner. Any features described as modules, components, or the like may also be implemented together in an integrated logic device or separately as discrete but interoperable logic devices. If implemented in software, the techniques may be realized at least in part by a non-transitory processor-readable storage medium comprising instructions that, when executed by at least one processor, perform one or more of the methods described herein. The instructions may be organized into routines, programs, objects, components, data structures, etc., which may perform particular tasks and/or implement particular data types, and which may be combined or distributed as desired in various embodiments.

Computer-readable mediums may be any available media that can be accessed by a general purpose or special purpose computer system. Computer-readable mediums that store computer-executable instructions are non-transitory computer-readable storage media (devices). Computer-readable mediums that carry computer-executable instructions are transmission media. Thus, by way of example, and not limitation, embodiments of the disclosure can comprise at least two distinctly different kinds of computer-readable mediums: non-transitory computer-readable storage media (devices) and transmission media.

As used herein, non-transitory computer-readable storage mediums (devices) may include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

The steps and/or actions of the methods described herein may be interchanged with one another without departing from the scope of the claims. Unless a specific order of steps or actions is required for proper operation of the method that is being described, the order and/or use of specific steps and/or actions may be modified without departing from the scope of the claims.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the implementations that falls within the meaning and scope of the claims is to be embraced by the claims.

INDUSTRIAL APPLICABILITY

This disclosure generally relates to devices and methods for using banked memory structures for with use for accelerators. An example accelerator may include a DNN accelerator. The banked memory structure may be connected to parallel computation units without any mechanism for a computation unit to access data in any other memory bank other than the locally connected memory bank to the computation unit (e.g., no crossbar, rotation unit, or other interbank interconnection network). The crossbar or other interbank interconnect is typically very expensive in terms of area and power and limits the scalability of the solution. As such, using a banked memory structure without any mechanisms for a computation unit to access data in any other memory bank may linearly scale with addition of a parallel datapath.

In addition, the banked memory structure of the present disclosure may use an addressing scheme that enables the parallel computation units to work closely together to parallelize a computation at a fine granularity (e.g., individual loop iterations). When separate, non-communicating computation/memory units are employed in other designs, this technique is enabled by partitioning the computation at coarse granularity, e.g., giving each unit a larger independent task and not a single iteration of a loop. This coarse partitioning can be more difficult at the software level and can lead to load imbalance.

One reason the devices and methods of the present disclosure may combine a strictly partitioned banked memory with fine-grain parallelization is that there are multiple memory structures in the datapaths, and at least one of the memory structures is of the more conventional variety that allows communication across the banks (e.g., a multi-port memory that implicitly includes a crossbar). Thus, data values that require communication across banks can use this other memory, and the banked memory structure is used only for data that does not require this kind of communication.

The devices and methods described herein may increase effective throughput of accelerator by segmenting and isolating dataflows in datapath and memory. The devices and methods provides each data channel with its own register memory bank, and thus, ensures that new addition of data channels increases not only its datapath throughput but also its memory bandwidth so as to prevent memory bandwidth from being bottleneck for the performance.

The devices and methods described herein use a memory address decoder and distributed local memory structure that generate independent concurrently-executable memory access patterns and dataflows. The devices and methods described herein not only have low cost in its hardware implementation, but also keeps a straight-forward single-threaded programming model. For example, previous multi-ported VRFs grew hardware resources use quadratically because any data channel needs an access to any word in one shared register-file. In contrast, the methods and devices divide one memory space into multiple spaces (e.g., if there are N channels, the memory space is divided by N) in order to split one register memory into multiple independent memory banks and to remove extra hardware overhead (such as multiplexer/demultiplexer or multi-port block RAM component).

A significant challenge in a banked memory architecture is how to map reference addresses to the independent memory banks such that the references from each data channel always map to the local memory. The devices and methods described herein use an efficient and straight-forward decoding scheme that assumes the data channels operate on independent iterations of a loop and automatically places the iteration-local variables in the proper memory bank.

The devices and methods may use a program that is written using a single-threaded programming model. In an implementation, a programmer may provide additional information to identify parallel loops. First, the "Iteration" counter is set to total number of iterations to process and "Tiles" is set to the size of vector to process (in multiplies of the hardware native vector size). Then, the memory locations for a given array of vectors is striped across the banks in units of "Tiles" native vector entries. This the read/write addresses on the first bank memory can be used by all the banks as iterations are distributed across different data channels.

The logical programmer view is that when there are multiple loop iterations that go through the same set of operations in a program, data vectors and their dataflows are automatically distributed across banks. And the programmer can index them as group by memory address in the first bank.

As a simplified example use case, consider the evaluation of the following expression:

$$D = A + B \times C$$

where all the values (A, B, C, D) are 6×4 matrices and all of the operations are performed element-wise. Further, assume that each data channel operates on a variable-length vector of elements. Next, treat each matrix as a group of four-element vectors, and enable up to 6 channels to operate concurrently on these vectors (one row per channel). If all the data is stored in a logically unified memory, there will be significant expense and complexity in enabling all 6 channels to read concurrently from that memory. However, using the banked memory of the present disclosure, each channel can operate on its own slice of each matrix independently. By setting "tiles" to 4 and "iterations" to 6, our system will spread the 6 iterations out across the available channels (reusing channels if the available channels are less than 6), and map the elements 4 at a time to each channel. Thus, the row(s) that each channel needs to access will be found in its local memory bank.

Data movement across the data channels requires extra logic but this extra data-movement logic can easily be implemented by either keeping just one of register memory in the system to be multi-ported or putting a de/serializer in a switch. In addition, the extra data-movement logic may be implemented by embedding a deserializer and a serializer within a multi-bank VRF. Moreover, it should be noted that data movement across different channels happens only at the beginning and the end of the whole multiple chain operations that compose one deep learning layer (such as fully-connected layer or layer-normalization layer) and thus its cost is amortized over multiple chain operations and almost hidden.

One technical advantage of the devices and methods is a low cost in structure and/or hardware implementations and consequent higher performance. The devices and methods ensure that the dataflows to parallelize are always confined in the own memory spaces of the dataflows without crossing, as such, the devices may be implemented as a straight-forward banked memory. Moreover, any control logic of one bank can be shared across all the banks since a dataflow from and/or to the first bank may represent the whole dataflows. In contrast, many of existing DNN accelerators assign one contiguous chunk of memory space to local memory without taking full benefits in parallel dataflow when accessing memory, and thus, existing DNN accelerators have more expensive hardware to multiplex dataflows, de-multiplex dataflows, complex memory hierarchy and control logics, and/or complicated multi-threaded programming models.

Another technical advantage of the devices and methods is scalability. Many existing accelerators have one physical memory address with a complex memory hierarchy (e.g., caches), which makes a cost of adding parallel datapaths more expensive than linear complexity. In comparison, the devices and methods maintain localized data-in and/or out flows within distributed memory when executing operations. As such, the architecture of the devices may linearly scale with addition of a parallel datapath.

(A1) Some implementations include a banked memory structure (e.g., architecture 400, architecture 500, or multi-bank VRF 600) for use with an accelerator. The banked memory structure (e.g., architecture 400, architecture 500, or multi-bank VRF 600) may include a plurality of local memory (e.g., VRF 408, 410, 412, 430, 432, 434; VRFs 502, 504, 506; or individual local memory 608, 610, 612), wherein the plurality of local memory includes a memory decoder (e.g., the shared read/write control signals (Wf_fsm 620, rd_fsm 622) across the memory banks 608, 610, 612). The banked memory structure (e.g., architecture 400, architecture 500, or multi-bank VRF 600) may include a plurality of computation units (e.g., MVM 418, 420, 422, MFU 424, 426, 428; or MVM_IVRF 508, MFU_IVRF 502, and/or SPU 516). The banked memory structure (e.g., architecture 400, architecture 500, or multi-bank VRF 600) may include a plurality of channels (e.g., data channels 402, 404, 406; or channels 602, 604, 606), wherein each channel of the plurality of channels (e.g., data channels 402, 404, 406; or channels 602, 604, 606) is paired with a separate local memory of the plurality of local memory (e.g., VRF 408, 410, 412, 430, 432, 434; VRFs 502, 504, 506; or individual local memory 608, 610, 612) and one computation unit of the plurality of computation units (e.g., MVM 418, 420, 422, MFU 424, 426, 428; or MVM_IVRF 508, MFU_IVRF 502, and/or SPU 516). The memory decoder (e.g., the shared read/write control signals (Wf_fsm 620, rd_fsm 622) receives data for the accelerator, wherein the data includes a plurality of vectors (e.g., vectors 614, 616, 618) and each vector of the plurality of vectors (e.g., vectors 614, 616, 618) is assigned by the memory decoder to one channel of the plurality of channels (e.g., data channels 402, 404, 406; or channels 602, 604, 606) for processing by the computation unit associated with the channel.

(A2) In some implementations of the banked memory structure of A1, each computation unit is configured to process the data provided to it without accessing data from other channels or sharing the data with the other channels.

(A3) In some implementations of the banked memory structure of A1 or A2, each computation unit is configured to write the data into the separate local memory associated with the channel and read the data from the separate local memory associated with the channel.

(A4) In some implementations of the banked memory structure of any of A1-A3, the memory decoder is configured to send the data back to the network after the processing by the computation unit.

(A5) In some implementations of the banked memory structure of any of A1-A4, the memory decoder is configured to use a memory address policy to map each vector of the plurality of vectors to a memory address of the separate local memory. The memory decoder is configured to use the memory address policy to iterate through each vector of the plurality of vectors, and at each iteration, the memory decoder sequentially maps each vector of the plurality of vectors to a next separate local memory of the plurality of local memory.

(A6) In some implementations of the banked memory structure of any of A1-A5, each computation unit of the plurality of computation units is configured to operate in parallel on the data assigned to each computation unit.

(A7) In some implementations of the banked memory structure of any of A1-A6, the separate local memory comprises a vector register file (VRF)

(A8) In some implementations of the banked memory structure of any of A1-A7, each channel includes a matrix-vector multiplier (MVM).

(A9) In some implementations of the banked memory structure of any of A1-A8, the accelerator is a deep neural network (DNN) accelerator.

(B1) Some implementations include a method performed by a memory decoder (e.g., the shared read/write control signals (Wf_fsm 620, rd_fsm 622) of an accelerator. The method may include receiving data for use with the accelerator. The method may include identifying a plurality of vectors (e.g., vectors 614, 616, 618) for the data. The method may include identifying a plurality of local memory (e.g., individual local memory 608, 610, 612) in the accelerator. The method may include for each vector of the plurality of vectors (e.g., vectors 614, 616, 618): selecting a separate local memory of the plurality of local memory (e.g., individual local memory 608, 610, 612) for use with the vector; mapping an address of the of the separate local memory to the vector; and using the mapping to send the data for the vector to a data channel (e.g., channels 602, 604, 606) associated with the separate local memory (e.g., memory banks 608, 610, 612).

(B2) In some implementations, the method of B1 may include identifying a number of tiles for the vector based on a vector size for the vector; and providing a tile index for each tile of the vector for use with mapping the address of the separate local memory to the vector.

(B3) In some implementations of the method of B1 or B2, each tile of the vector remains in the data channel associated with the separate local memory.

(B4) In some implementations of the method of any of B1-B3, selecting the separate local memory for the vector occurs in a sequential order of the plurality of local memory.

(B5) In some implementations of the method of any of B1-B4, a subset of plurality of local memory is used for selecting the separate local memory for the vector.

(B6) In some implementations of the method of any of B1-B5, each separate local memory is associated with a computation unit of a plurality of computation units and the computation unit performs processing on the data for the separate local memory.

(B7) In some implementations of the method of any of B1-B6, the plurality of computation units perform processing on the data in parallel.

(B8) In some implementations of the method of any of B1-B7, each of the separate local memory of the plurality of local memory are accessed for independent concurrently executable memory access patterns.

(B9) In some implementations of the method of any of B1-B8, the separate local memory is a vector register file (VRF), and the accelerator is a deep neural network (DNN) accelerator.

(C1) Some implementations include a device (e.g., FPGA 1022, FPGA 1024, and FPGA 1026). The device (e.g., FPGA 1022, FPGA 1024, and FPGA 1026) may include one or more processors (e.g., IMP 1210, CSP 1220, OMP 1240). The device may include memory in electronic communication with the one or more processors (e.g., IMP 1210, CSP 1220, OMP 1240). The device may include instructions stored in the memory, the instructions being executable by the one or more processors (e.g., IMP 1210, CSP 1220, OMP 1240) to: receive data for use with an accelerator (e.g., FPGA 1022, FPGA 1024, and FPGA 1026); identify a plurality of vectors (e.g., vectors 614, 616, 618) for the data; identify a plurality of local memory (e.g., individual local memory 608, 610, 612) in the accelerator; for each vector of the plurality of vectors (e.g., vectors 614, 616, 618): select a separate local memory of the plurality of local memory (e.g., individual local memory 608, 610, 612) for use with the vector; map an address of the separate local memory to the vector; and use the mapping to send the data for the vector to a data channel (e.g., channels 602, 604, 606) associated with the separate local memory (e.g., memory banks 608, 610, 612).

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A memory architecture, comprising:
   a plurality of memory banks;
   a plurality of data channels, wherein each channel of the plurality of data channels is paired with a separate memory bank of the plurality of memory banks;
   a switch in communication with the plurality of memory banks and the plurality of data channels, wherein the switch receives data and provides the data to the plurality of data channels; and
   a scratchpad in communication with the switch, wherein the scratchpad identifies one memory bank of the plurality of memory banks as a multi-port memory bank.

2. The memory architecture of claim 1, wherein the data flows independently through each memory bank of the plurality of memory banks without crossing into a different memory bank.

3. The memory architecture of claim 1, wherein the one memory bank distributes the data across different channels of the plurality of data channels.

4. The memory architecture of claim 3, wherein the data moves across the different channels at a start of an operation or at an end of the operation.

5. The memory architecture of claim 4, wherein the operation is one deep learning layer.

6. The memory architecture of claim 1, wherein the one memory bank is used as a data shuffler.

7. The memory architecture of claim 1, further comprising:
   a deserializer in communication with the switch that distributes the data across different channels of the plurality of data channels at a start of an operation.

8. The memory architecture of claim 1, further comprising:
   a serializer in communication with the switch that receives the data from across different channels of the plurality of data channels at an end of an operation.

9. The memory architecture of claim 1, wherein each memory bank of the plurality of memory banks includes a vector register file (VRF).

10. The memory architecture of claim 1, wherein each channel of the plurality of data channels includes a matrix-vector multiplier (MVM).

11. The memory architecture of claim 1, further comprising:
a plurality of computation units, wherein each channel of the plurality of data channels is paired with one computation unit of the plurality of computation units.

12. The memory architecture of claim 11, wherein each computation unit is configured to process the data provided to it without accessing the data from other channels or sharing the data with the other channels.

13. The memory architecture of claim 11, wherein each computation unit is configured to write the data into the separate memory bank associated with the data channel and read the data from the separate memory bank associated with the data channel.

14. The memory architecture of claim 11, wherein each computation unit of the plurality of computation units is configured to operate in parallel on the data assigned to each computation unit.

15. The memory architecture of claim 1, wherein the memory architecture is used with a deep neural network (DNN) accelerator.

* * * * *